US011762208B1

(12) United States Patent
Dias et al.

(10) Patent No.: US 11,762,208 B1
(45) Date of Patent: Sep. 19, 2023

(54) COOLING A VIRTUAL REALITY HEADSET

(71) Applicant: LENOVO GLOBAL TECHNOLOGY (UNITED STATES) INC., Morrisville, NC (US)

(72) Inventors: Israel Silva Dias, Apex, NC (US); Gary D. Cudak, Morrisville, NC (US)

(73) Assignee: LENOVO GLOBAL TECHNOLOGY (UNITED STATES) INC., Morrisville, NC (US)

( * ) Notice: Subject to any disclaimer, the term of this patent is extended or adjusted under 35 U.S.C. 154(b) by 0 days.

(21) Appl. No.: 17/709,751

(22) Filed: Mar. 31, 2022

(51) Int. Cl.
*G02B 27/01* (2006.01)
*G06F 1/20* (2006.01)
*H05K 7/20* (2006.01)

(52) U.S. Cl.
CPC ........ *G02B 27/0176* (2013.01); *G06F 1/206* (2013.01); *H05K 7/20154* (2013.01); *H05K 7/20209* (2013.01)

(58) Field of Classification Search
CPC .. G02B 27/0176; G02B 27/017; G02B 26/00; G02B 2027/0178; G02B 2027/0138; G06F 1/206; G06F 1/163; H05K 7/20154; H05K 7/20209; H05K 7/20172; H05K 7/20136; H05K 7/20972; G05B 2219/32014
See application file for complete search history.

(56) References Cited

U.S. PATENT DOCUMENTS

| 8,226,228 | B2 | 7/2012 | Shantha et al. | |
|---|---|---|---|---|
| 9,703,103 | B2 * | 7/2017 | Araki | G02B 27/028 |
| 10,712,791 | B1 * | 7/2020 | Stanley | G06F 1/206 |
| 2011/0145978 | A1 * | 6/2011 | Harbin | G02B 27/0176 2/209.13 |
| 2011/0239354 | A1 * | 10/2011 | Celona | A42B 3/04 2/422 |
| 2016/0004085 | A1 * | 1/2016 | Stroetmann | G02B 27/017 345/8 |
| 2016/0255748 | A1 * | 9/2016 | Kim | G02B 27/017 361/695 |
| 2017/0184863 | A1 * | 6/2017 | Balachandreswaran | G02B 27/0176 |
| 2018/0098465 | A1 * | 4/2018 | Reynolds | G02B 27/028 |
| 2018/0196485 | A1 * | 7/2018 | Cheng | G02B 27/0006 |
| 2018/0307282 | A1 * | 10/2018 | Allin | G06F 1/20 |
| 2019/0072772 | A1 * | 3/2019 | Poore | G06F 3/013 |
| 2019/0075689 | A1 * | 3/2019 | Selvakumar | H05K 7/20972 |
| 2019/0192965 | A1 * | 6/2019 | Chapman | A63F 13/50 |

(Continued)

OTHER PUBLICATIONS

Qiu, Virtual reality helmet device with excellent heat dissipation, CN-114488533-A, PE2E search translation (Year: 2022).*

(Continued)

*Primary Examiner* — Michael A Matey

(57) ABSTRACT

Systems for cooling a virtual reality (VR) headset, including a viewing module that includes a VR display; and a cooling module that includes: a Peltier element having a cold side and a hot side; a blower mounted on the cold side of the Peltier element and configured to draw air across the cold side of the Peltier element and into a first duct; and a fan mounted on the hot side of the Peltier element and configured to draw air from a second duct, where a portion of the first duct and a portion of the second duct are positioned within the viewing module, and where each of the portions includes multiple openings.

20 Claims, 4 Drawing Sheets

(56) References Cited

U.S. PATENT DOCUMENTS

2021/0185855 A1* 6/2021 Maric ............... G06F 3/011
2023/0025019 A1* 1/2023 Youngblood ......... G16H 40/63

OTHER PUBLICATIONS

Bian et al., VR Display device and headset VR device, CN-114624892-A, PE2E search translation. (Year: 2022).*

Best Dehumidifier Reviews—Commercial & Home, How Do Peltier Dehumidifiers Work?, URL: https://bestdehumidifier.reviews/how-do-peltier-dehumidifiers-work/, dated Jul. 26, 2021, 9 pages.

Feher Helmets, The World's First Air Conditioned Helmet, URL: https://feherhelmets.com/, printed Jan. 12, 2022, 5 pages.

TYCO TECH, Keep your VR Headset and Face nice and Cool! (No more fog too!), URL: https://www.youtube.com/watch?v-t5ffiiw3qdM, dated Jul. 1, 2019, 2 pages.

* cited by examiner ly exploded view.

COOLING A VIRTUAL REALITY HEADSET

BACKGROUND

Field of the Disclosure

The field of the disclosure is data processing, or, more specifically, methods, apparatus, and products for cooling a virtual reality (VR) headset.

Description Of Related Art

A virtual reality (VR) headset is a head-mounted device that provides virtual reality to a user wearing the device. VR headsets, if worn for a length of time, may become hot and uncomfortable to the user, and may even become fogged, preventing the user from continued use of the headset.

SUMMARY

Apparatus and systems for cooling a VR headset according to various embodiments are disclosed in this specification. An embodiment in accordance with the present disclosure is directed to a VR headset that may include: a viewing module comprising a VR display; and a cooling module that includes: a Peltier element comprising a cold side and a hot side; a blower mounted on the cold side of the Peltier element and configured to draw air across the cold side of the Peltier element and into a first duct; and a fan mounted on the hot side of the Peltier element and configured to draw air from a second duct, wherein a portion of the first duct and a portion of the second duct are positioned within the viewing module, and wherein each of the portions includes multiple openings.

Another embodiment in accordance with the present disclosure is directed to an apparatus for cooling a VR headset, where the apparatus may include: a Peltier element comprising a cold side and a hot side; a blower mounted on the cold side of the Peltier element and configured to draw air across the cold side of the Peltier element and into a first duct; and a fan mounted on the hot side of the Peltier element and configured to draw air from a second duct.

The foregoing and other objects, features and advantages of the disclosure will be apparent from the following more particular descriptions of exemplary embodiments of the disclosure as illustrated in the accompanying drawings wherein like reference numbers generally represent like parts of exemplary embodiments of the disclosure.

DETAILED DESCRIPTION

Figure 1:
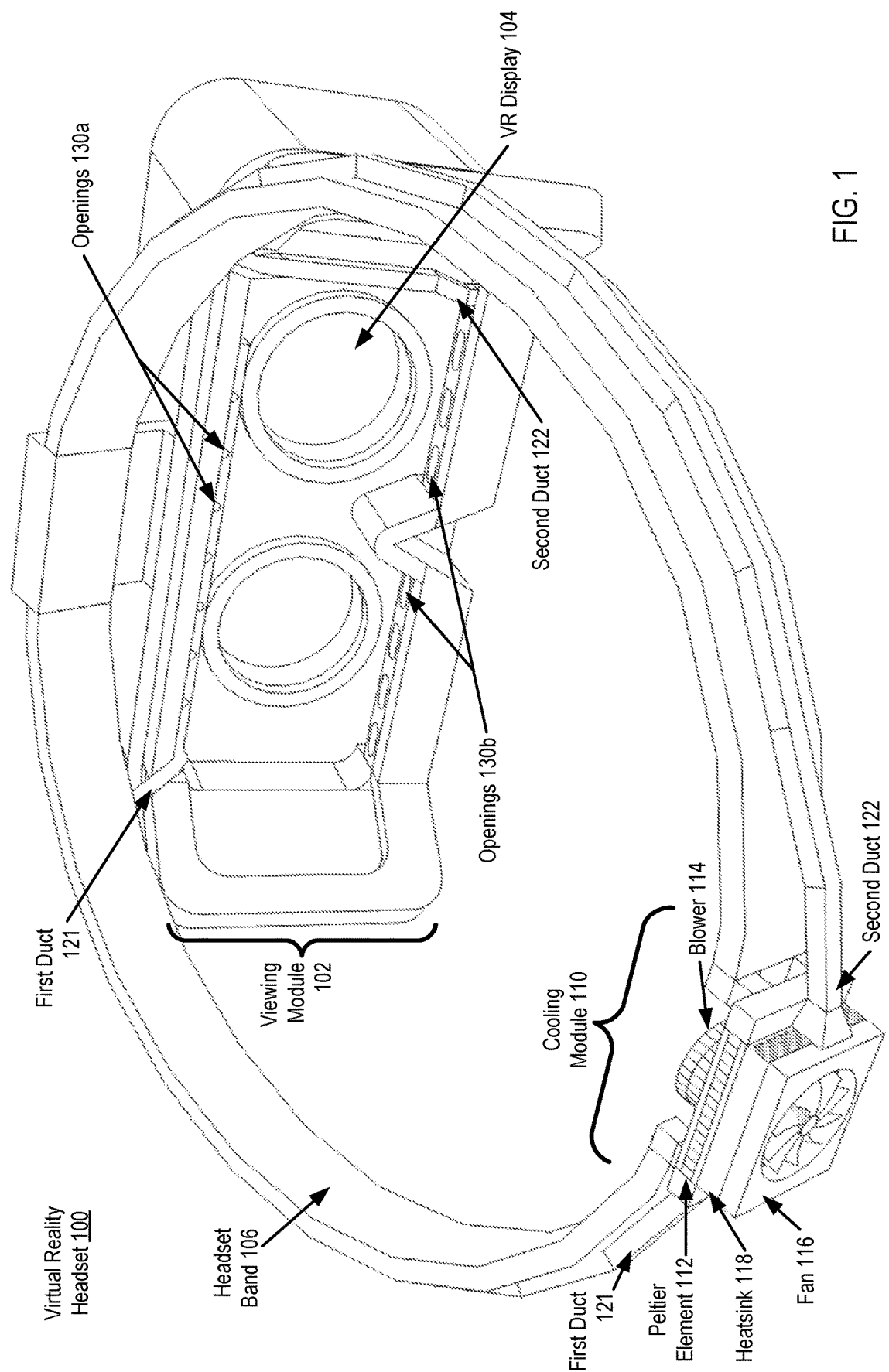
FIG. 1 shows an example line drawing of a system, where the system is a VR headset shown in an assembled view.

Exemplary apparatus and systems for cooling a virtual reality (VR) headset in accordance with the present disclosure are described with reference to the accompanying drawings, beginning with FIG. 1. FIG. 1 sets forth a line drawing of an example system configured for cooling a VR headset according to embodiments of the present disclosure. The system of FIG. 1 may include a VR headset 100 that includes a viewing module 102, a headset band 106, a cooling module 110, a first duct 121, and a second duct 122. The example headset band 106 of FIG. 1 may be coupled to both the viewing module 102 and the cooling module 110. The example first duct 121 and the example second duct 122 may be mounted on the headset band 106 and each may be coupled between the cooling module and the viewing module.

The example viewing module 102 of FIG. 1 includes a VR display 104 for displaying content to a user wearing the VR headset 100. The viewing module is configured, when worn by a user, to position the VR display 104 in front of the user for viewing VR content. The viewing module may be configured with padding (not shown in FIG. 1) around the inside perimeter of the viewing module. The padding of the viewing module may be configured to block outside light from entering into the viewing module and into the user's field of view, which may in turn prevent outside light from interfering with the VR display 104. The viewing module, when worn by the user, may be positioned against the user's face to eliminate air gaps between the padding of the viewing module and the user to optimize the user's view of the VR display 104. A user wearing the VR headset may, over time, increase the ambient temperature of the air within the viewing module and between the user's face and the VR display. Similarly, the humidity level of the air within the viewing module may increase over prolonged use by a user wearing the VR headset. Readers of skill in the art will recognize that increased temperatures and humidity levels of air within the viewing module and against the user's face may lead to discomfort to the user, fogging of the VR display, a decrease in VR headset performance, and the like.

The example first and second ducts of FIG. 1 may be hollow ducts or tubes configured to allow airflow between the cooling module and the viewing module. A portion of the first duct 121 and a portion of the second duct 122 may be positioned within the viewing module 102. The portion of the first duct within the viewing module may be positioned above the portion of the second duct within the viewing module. The portions of the first and second ducts positioned within the viewing module may each include openings, such as openings 130a and 130b shown in FIG. 1. The openings 130a and 130b may be configured to circulate air within the viewing module by moving air from the openings 130a of the first duct to the openings 130b of the second duct.

The openings 130a of the first duct 121 may be smaller in size than the openings 130b of the second duct 122. For example, the openings 130a of the first duct may have a smaller diameter than the openings 130b of the second duct. The portion of the second duct positioned within the viewing module may include a greater number of openings than the portion of the first duct positioned within the viewing module. The openings 130a and 130b of FIG. 1 are shown as being visible to a user. In another embodiment, the openings 130a and 130b may be shielded from view or partially covered by elements of the viewing module. The portions of the first and second ducts positioned within the viewing module may be configured to be removable by a user for cleaning or repair. The example first and second ducts of FIG. 1 are shown as each being on opposite sides of the VR headset. In another embodiment, the first and second ducts may be positioned on the same side of the VR headset or positioned over the top of the VR headset. The portions of the first and second ducts positioned within the viewing module may be positioned to allow the padding of the viewing module to maintain a seal against the user's face when worn, so as to optimize the user's view of the VR display.

The example cooling module 110 of FIG. 1 includes a Peltier element 112, a blower 114, a heatsink 118, and a fan 116. The cooling module 110 may be configured to cool the viewing module 102 of the VR headset 100 by circulating air through the viewing module via the first and second ducts. The example Peltier element 112 is a Peltier device that utilizes the Peltier effect to create a heat flux at the junction of two different types of materials. Such a Peltier device may be used for cooling and is configured to transfer heat from one side of the device to the other side of the device, with consumption of electrical energy, in dependence on the direction of the current running through the device. The example Peltier element 112 includes a hot side and a cold side (see FIG. 2 for more detail).

The example blower 114 of FIG. 1 may be mounted on the cold side of the Peltier element 112 and may be configured to draw air across the cold side of the Peltier element 112 and into the first duct 121. The example blower 114 of FIG. 1 may be a centrifugal fan or impeller configured to force outside air into the first duct. Readers of skill in the art will recognize that mounting the blower 114 against the cold side of the Peltier element 112 will cool the incoming air as it is being forced into the first duct 121 and towards the viewing module 102.

The example fan 116 of FIG. 1 may be mounted on the hot side of the Peltier element 112 and may be configured to draw air from the second duct 122. The example fan of FIG. 1 may be an axial fan configured to pull air out from the second duct 122 and away from the cooling module 110. The fan 116 may be mounted directly to the hot side of the Peltier element 112 or may be mounted to a heatsink 118 that is in turn mounted to the hot side of the Peltier element (as shown in FIG. 1). The fan 116 may be configured to aid in the circulation of air moving through the ducts while simultaneously cooling the hot side of the Peltier element 112 by drawing air from the second duct and across the heatsink 118 and hot side of the Peltier element. Readers will note that, to aid in the efficiency of air circulation, the fan 116 in FIG. 1 is configured to push air away from the cooling module in the same direction as the air which is being pulled into the blower 114 (namely; along an axis intersecting both the cooling module and the viewing module and, in a direction, moving away from the interior side of the viewing module).

The example heatsink 118 of FIG. 1 may be mounted directly to the hot side of the Peltier element 112 and may be configured to cool the hot side of the Peltier element. The heatsink 118 may have a straight-fin arrangement with the fins running parallel to the second duct to aid in air circulation caused by the fan drawing air from the second duct and across the heat sink. The heatsink 118 may have a pin-fin arrangement to aid in increased airflow through the heatsink and fan 116. The fan 116 of FIG. 1 is shown as being mounted onto the heatsink 118. In another embodiment the fan 116 may be positioned within the heatsink 118 or included within the heatsink as a single unit.

The example cooling module 110 of FIG. 1 may be controlled by a user wearing the VR headset 100 to alter the strength of the cooling effects produced by the cooling module. In one embodiment the cooling module may include a control element, such as a switch, a slider switch, a dial or knob, or the like, that may control the fan speed of the fan 116, the blower 114, or both simultaneously. Such a control element (not shown in FIG. 1) may be positioned on the cooling module 110, the viewing module 102, or the headset band 106. By controlling the fan speed, a user may thereby alter the rate of air circulation through the VR headset and in turn alter the cooling rate of the humidity level and temperature within the viewing module.

In another embodiment, the VR headset may include one or more sensors, such as a heat sensor and a humidity sensor, and may be configured to alter the fan speed of the fan 116 and blower 114 automatically based on temperature and humidity measurements from the sensors. The sensors (not shown in FIG. 1) may be positioned within the viewing module, exterior to the viewing module, or both. For example, the VR headset may be configured to change the fan speed of the fan and blower based on temperature or humidity measurements from the sensors reaching a threshold. Such a threshold may be a preset threshold from the manufacturer or may be selected by a user of the VR headset. In one embodiment, the threshold may be determined based on user preferences selected within a user profile of the VR user. For example, different users of the VR headset may have different associated user profiles with differing threshold settings to select a preferred strength of the cooling effects produced by the cooling module. The VR headset may be configured to calculate the required fan speed or frequency with which the cooling module is operating in order to maintain the temperature within the cooling module at a desired level while preventing condensation and fog from forming on the VR display.

Figure 2:
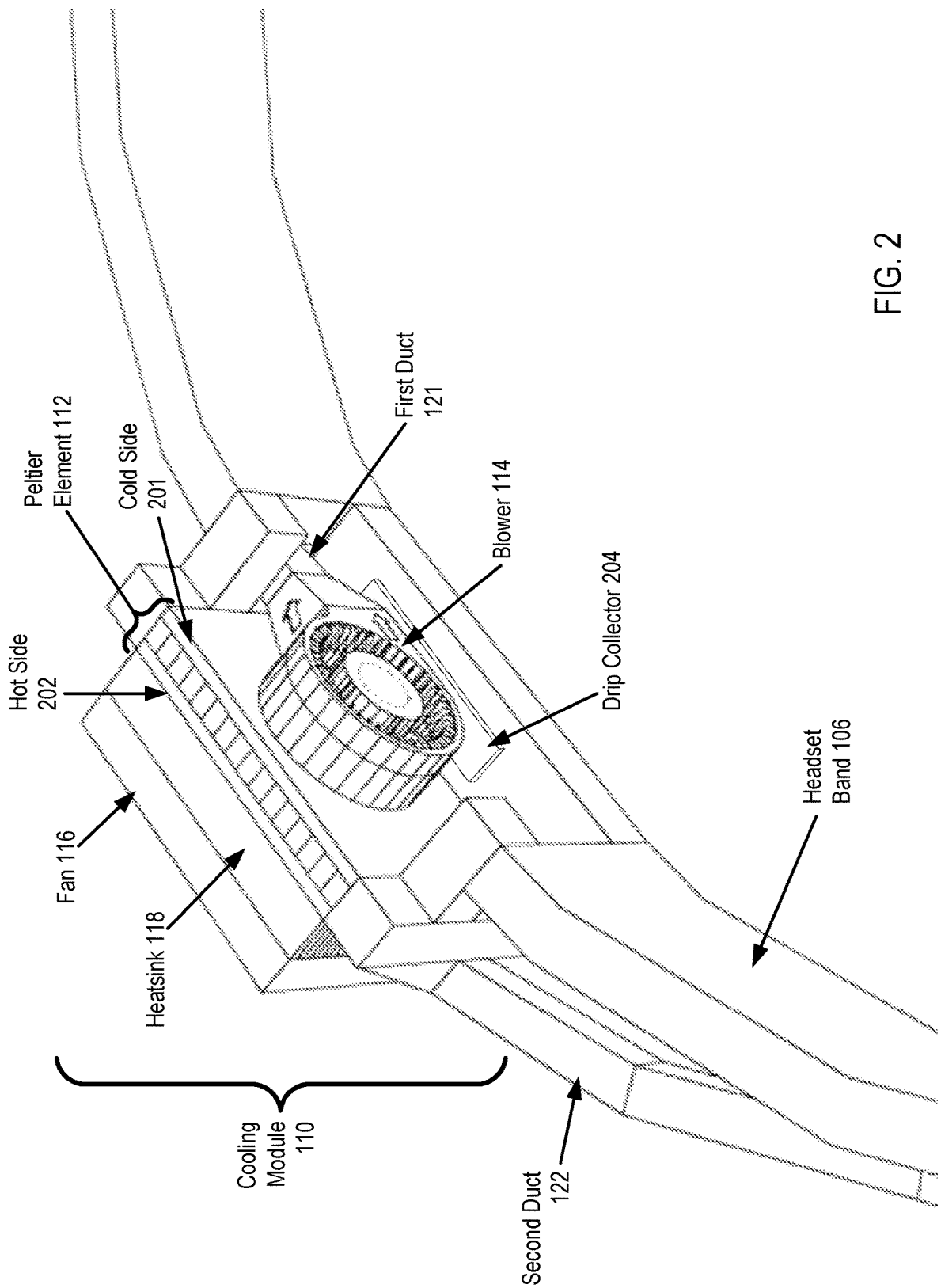
FIG. 2 shows an example line drawing of an apparatus for cooling a VR headset.

For further explanation, FIG. 2 sets forth an example line drawing of an apparatus configured for cooling a VR headset according to embodiments of the present disclosure. The example apparatus of FIG. 2 may be the cooling module 110 of FIG. 1, shown in a close up view for explanation. The cooling module 110 may be positioned at the rear of the VR headset, opposite to the viewing module 102 of FIG. 1. In such a configuration, the cooling module may act as a counterbalance to the viewing module. The cooling module 110 of FIG. 2 shows the cold side 201 and the hot side 202 of the Peltier element 112.

The example blower 114 of FIG. 2 may be mounted directly on the cold side 201 of the Peltier element 112 and may be configured to draw air across the cold side of the Peltier element 112 and into the first duct 121. The back surface of the blower 114 which is mounted to the cold side 201 of the Peltier element may be composed of a thermally conductive material, such as an aluminum alloy, copper, or the like. In another embodiment, the blower may be mounted to the cold side of the Peltier element with the back surface removed to allow the air within the blower to directly contact the cold side 201 of the Peltier element before being forced into the first duct 121.

The cooling module 110 of FIG. 2 may include a drip collector 204 configured to collect condensation that is formed by the blower 114. The example drip collector 204 may be mounted directly to the bottom of the blower or may be mounted to the cooling module at a position below the blower. The drip collector 204 may be a sponge or foam pad configured to absorb condensation formed by the blower, or the drip collector may be configured as a drip tray to collect condensation. The drip collector 204 may be treated with antibacterial chemicals and may be removable from the cooling module for replacement, repair, cleaning, or the like.

The cooling module 110 may include a motor (not shown in FIG. 2) configured to power the fan 116 and the blower 114. The fan and the blower may be powered by separate motors or may be powered by a single shared motor. In one embodiment, the fan 116 and the blower 114 may share a single axle and be powered by a single motor positioned within the cooling module 110. In such an embodiment, the shared motor may be positioned within the fan 116, within the blower 114, or within a cavity of the Peltier element 112. Readers of skill will understand that, in such an embodiment, the fan 116 and the blower 114 may be positioned relative to one another so as to be axially aligned.

The cooling module 110 may include a control module (not shown in FIG. 2) configured to manage the cooling module. The control module may include a thermoelectric cooler ('TEC') controller for controlling the Peltier element and a controller for the motor to adjust fan speed according to various embodiments of the present disclosure. The control module may communicate with the VR headset to receive feedback information associated with a user profile or a game being played by a user. The control module may also receive feedback information from a control element, such as a slider switch or knob, to adjust the fan speed of the fan 116 and the blower 114.

The example cooling module 110 of FIG. 2 shows a single Peltier element 112. In other embodiments not shown in FIG. 2, the cooling module 110 may include multiple Peltier elements. In such embodiments, the Peltier elements may be radially positioned around an axis of the fan 116 and the blower 114. In one example embodiment, the fan and blower may share a single motor positioned between the fan and the motor, with the Peltier elements positioned radially around the motor. In such an embodiment, the fan and blower may each be coupled to the Peltier element with thermally conductive plates.

The example cooling module 110 of FIG. 2 is shown as being mounted to the VR headset in a fixed position. In another embodiment, the VR headset may be configured to allow the cooling module 110 to be repositioned relative to the headset band 106. For example, the VR headset may be configured to allow a user to adjust the position of the cooling module forward or backward from the back of a user's head when wearing the VR headset. In such an example, a user may choose to slide the cooling module further back from the user's head when wearing the VR headset to allow more room for air circulation into the blower 114. In one embodiment, the example cooling module 110 may be detachable from the VR headset for replacement, repair, cleaning, or the like.

Figure 3:
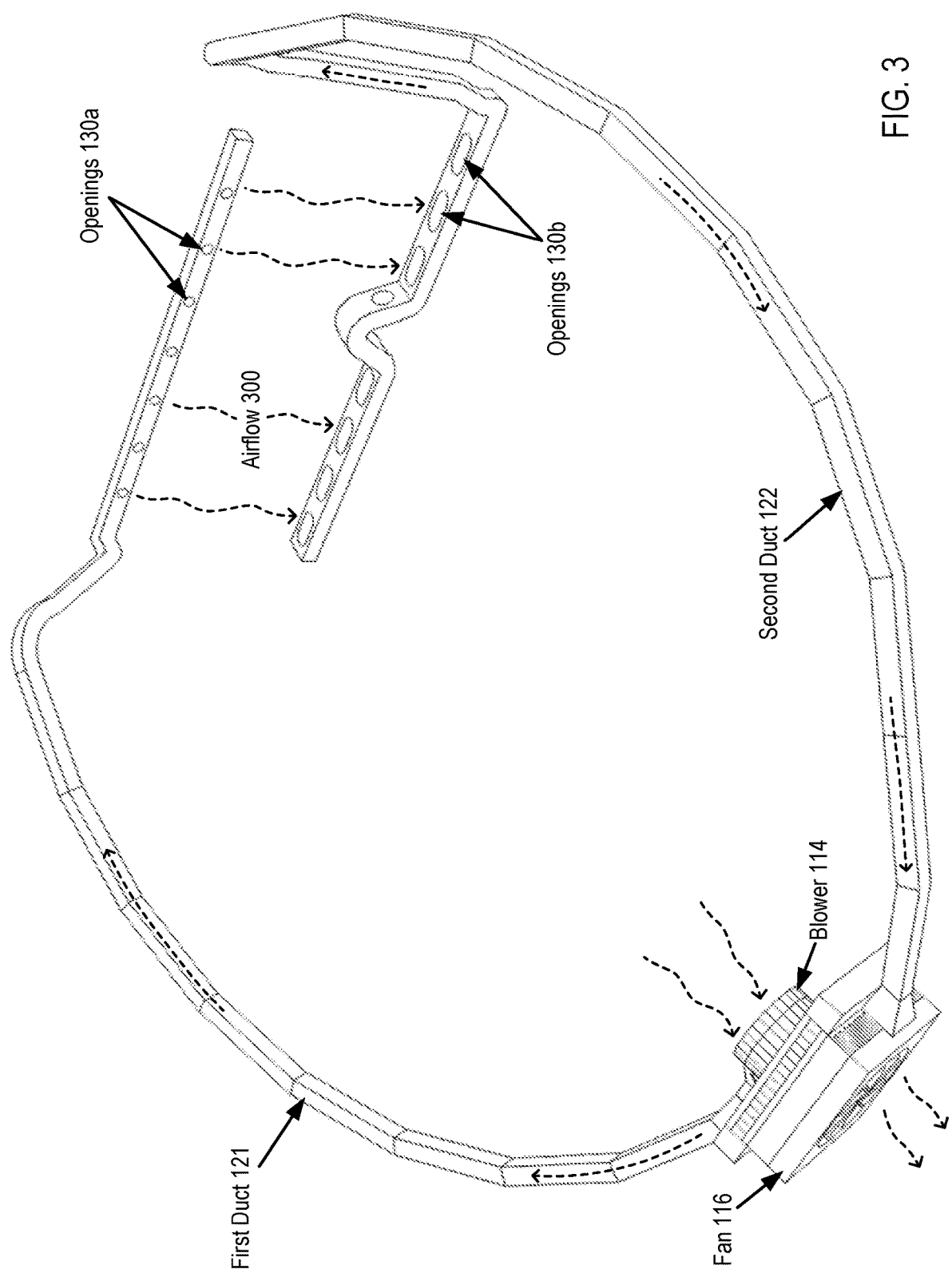
FIG. 3 shows an example line drawing of a portion of a system for cooling a VR headset, where the system is shown in a partially assembled view.

For further explanation, FIG. 3 sets forth a line drawing of an airflow diagram associated with the example system of FIG. 1 configured for cooling a VR headset according to embodiments of the present disclosure. The example system of FIG. 3 is shown in a partially assembled view for explanation and includes the first duct 121, the second duct 122, and the cooling module 110. The airflow diagram of FIG. 3 shows the direction of airflow 300 as it interacts with the VR headset 100 of FIG. 1, where the direction of airflow 300 is represented by dotted-line arrows moving in and around the system.

Readers will note that, to aid in the efficiency of air circulation, the direction of the air that is being sucked in by the blower 114 in FIG. 3 is moving in the same direction as the air that is being pushed away by the fan 116 (namely; along an axis intersecting both the cooling module and the viewing module and, in a direction, moving away from the interior side of the viewing module). The airflow 300 of FIG. 3 is shown as passing from outside of the VR headset and through the cooling module 110 into the first duct 121, passing through the openings 130a and 130b into the second duct 122, and exiting through the cooling module 110 back into outside air.

Figure 4:
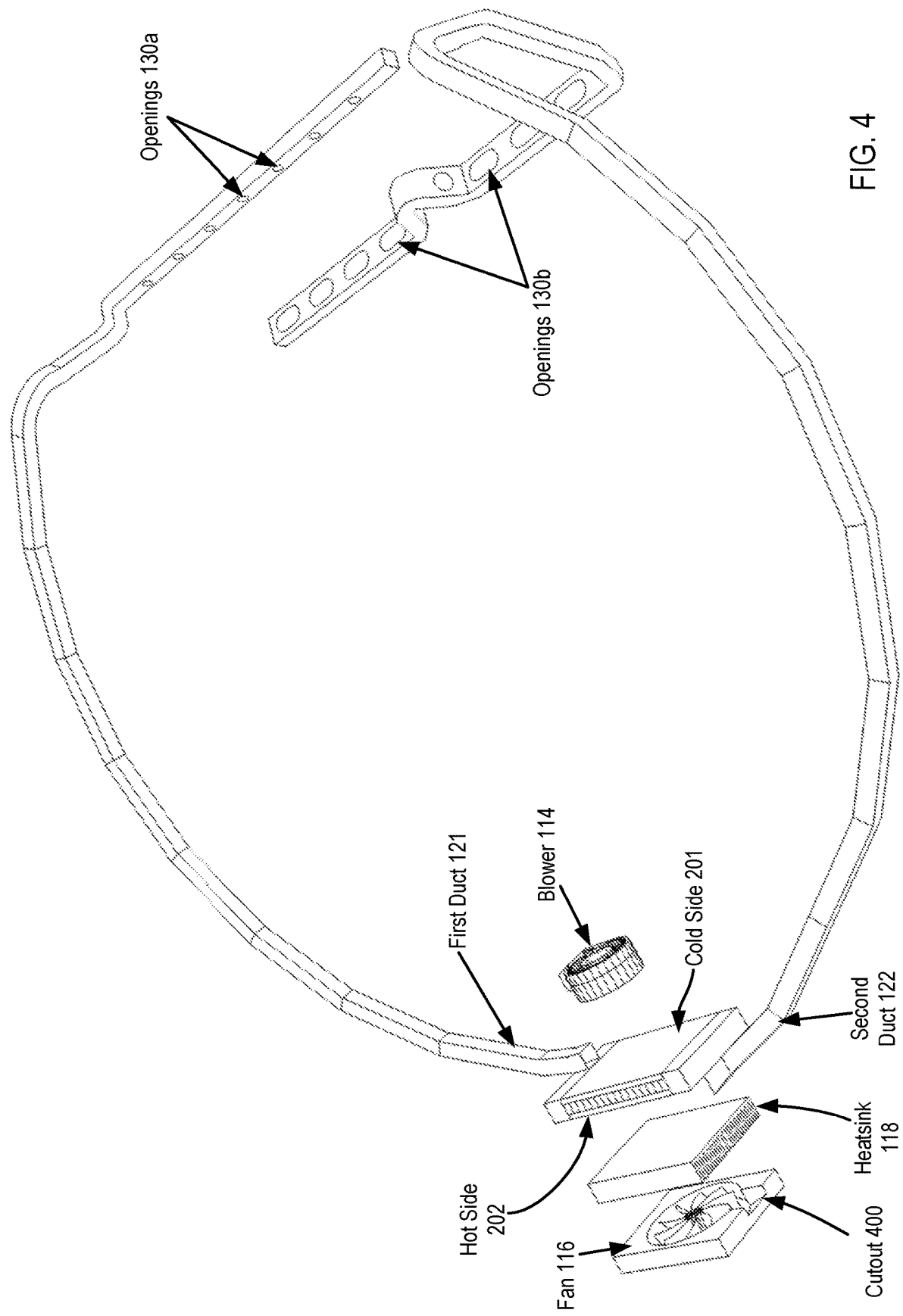
FIG. 4 shows an example line drawing of a portion of a system for cooling a VR headset, where the system is shown in a partially exploded view.

For further explanation, FIG. 4 sets forth a line drawing of the example system of FIG. 1 configured for cooling a VR headset according to embodiments of the present disclosure. The example system of FIG. 4 is shown in a partially exploded view for explanation. The example fan 116 of FIG. 4 may include a cutout 400 operable to mount to the second duct 122. The example cutout 400 of the fan 116 may be part of the fan housing and may aid in directing the air out from the second duct through the heatsink 118 and fan 116.

In view of the explanations set forth above, readers will recognize that the benefits of cooling a VR headset according to embodiments of the present disclosure include:

Increasing user comfort and viewing performance for a user wearing a VR headset by reducing temperature and humidity levels within the VR headset.

Reducing fogging of the VR display of a VR headset by reducing temperature and humidity levels within the VR headset.

Improving performance of a VR headset by reducing temperature and humidity levels within the VR headset.

It will be understood from the foregoing description that modifications and changes may be made in various embodiments of the present disclosure without departing from its true spirit. The descriptions in this specification are for purposes of illustration only and are not to be construed in a limiting sense. The scope of the present disclosure is limited only by the language of the following claims.

What is claimed is:

1. A virtual reality (VR) headset, comprising:
    a viewing module comprising a VR display; and
    a cooling module comprising:
        a Peltier element comprising a cold side and a hot side;
        a blower mounted on the cold side of the Peltier element and configured to draw air across the cold side of the Peltier element and into a first duct; and
        a fan mounted on the hot side of the Peltier element and configured to draw air from a second duct, wherein a portion of the first duct and a portion of the second duct are positioned within the viewing module, and wherein each of the portions comprises a plurality of openings.

2. The VR headset of claim 1, wherein the first duct and the second duct are coupled to both the cooling module and the viewing module.

3. The VR headset of claim 1, wherein the portion of the first duct is positioned, within the viewing module, above the portion of the second duct.

4. The VR headset of claim 1, wherein the cooling module is configured to draw air from the plurality of openings of the first duct into the plurality of openings of the second duct.

5. The VR headset of claim 1, wherein the plurality of openings of the first duct are smaller than the plurality of openings of the second duct.

6. The VR headset of claim 1, wherein the VR headset further comprises at least one of a heat sensor and a humidity sensor.

7. The VR headset of claim 1, wherein the cooling module is configured to cool a user wearing the VR headset.

8. The VR headset of claim 1, wherein the cooling module is configured to reduce a humidity level within the viewing module of the VR headset.

9. The VR headset of claim 1, wherein the VR headset further comprises a control element configured to control a fan speed of the blower and the fan.

10. The VR headset of claim 1, wherein the cooling module is positioned at a rear location of the VR headset.

11. The VR headset of claim 1, wherein a speed of the blower and the fan is controlled based on a user profile of a user of the VR headset.

12. The VR headset of claim 1, wherein the cooling module further comprises a drip collector.

13. An apparatus for cooling a virtual reality (VR) headset, the apparatus comprising:
- a Peltier element comprising a cold side and a hot side;
- a blower mounted on the cold side of the Peltier element and configured to draw air across the cold side of the Peltier element and into a first duct; and
- a fan mounted on the hot side of the Peltier element and configured to draw air from a second duct.

14. The apparatus of claim 13, further comprising a heatsink mounted on the hot side of the Peltier element and positioned between the Peltier element and the fan.

15. The apparatus of claim 13, wherein the blower and the fan are axially aligned.

16. The apparatus of claim 13, wherein both the blower and the fan are powered by a single motor.

17. The apparatus of claim 13, further comprising a plurality of Peltier elements.

18. The apparatus of claim 17, wherein each of the plurality of Peltier elements is radially positioned around an axis of the fan.

19. The apparatus of claim 13, further comprising a control element configured to control a fan speed of the blower and the fan.

20. The apparatus of claim 19, wherein the control element is one of a slider, knob, and switch.

* * * * *